(12) United States Patent
Kasai et al.

(10) Patent No.: US 7,379,331 B2
(45) Date of Patent: May 27, 2008

(54) NONVOLATILE SEMICONDUCTOR MEMORY INCLUDING REDUNDANT CELL FOR REPLACING DEFECTIVE CELL

(75) Inventors: Takamichi Kasai, Yokohama (JP); Hideo Kato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/401,418

(22) Filed: Apr. 11, 2006

(65) Prior Publication Data

US 2006/0227621 A1    Oct. 12, 2006

(30) Foreign Application Priority Data

Apr. 12, 2005    (JP) .............................. 2005-114749

(51) Int. Cl.
*G11C 11/34* (2006.01)
(52) U.S. Cl. .............................. 365/185.09; 365/185.29
(58) Field of Classification Search ........... 365/185.09, 365/185.29
See application file for complete search history.

(56) References Cited

U.S. PATENT DOCUMENTS 6,134,149 A * 10/2000 Lin ....................... 365/185.29
6,404,683 B1 * 6/2002 Yumoto ....................... 365/200
6,553,510 B1 * 4/2003 Pekny ........................... 714/6
6,850,436 B2    2/2005 Ogawa
6,868,032 B2    3/2005 Kozakai et al.
7,116,603 B2 * 10/2006 Kanda et al. ............ 365/225.7
2002/0051394 A1 * 5/2002 Tobita et al. ................ 365/221
2005/0190615 A1 * 9/2005 Linde et al. ................. 365/200

FOREIGN PATENT DOCUMENTS

JP    2000-57795    2/2000

* cited by examiner

*Primary Examiner*—Huan Hoang
*Assistant Examiner*—Anthan T Tran
(74) *Attorney, Agent, or Firm*—Oblon, Spivak, McClelland, Maier & Neustadt, P.C.

(57) ABSTRACT

A nonvolatile semiconductor memory includes a cell array, redundancy array, erase circuit, timer, and controller. The cell array has a plurality of memory cells. The redundancy array has a plurality of redundant cells capable of replacing the memory cell. The erase circuit performs an erase operation on a target cell including the memory cell or the redundant cell. The timer measures the time elapsed from the start of the erase operation performed for the target cell by the erase circuit. The controller stops the erase operation and replaces the target cell with the redundant cell, when detecting that a predetermined time has elapsed from the start of the erase operation by the measurement of the elapsed time by the timer.

9 Claims, 7 Drawing Sheets

| | Bit string | | | | | | | | | | |
|---|---|---|---|---|---|---|---|---|---|---|---|
| | 10 | 9 | 8 | 7 | 6 | 5 | 4 | 3 | 2 | 1 | 0 |
| | Enable | Disable | Replaced address | | | | | | | | |
| S0 | 0 | 0 | 0 | 0 | 0 | 0 | 0 | 0 | 0 | 0 | 0 |
| S1 | 1 | 0 | 0 | 0 | 0 | 0 | 1 | 0 | 1 | 1 | 0 |
| S2 | 1 | 1 | 0 | 0 | 0 | 1 | 0 | 0 | 1 | 0 | 1 |

FIG. 2

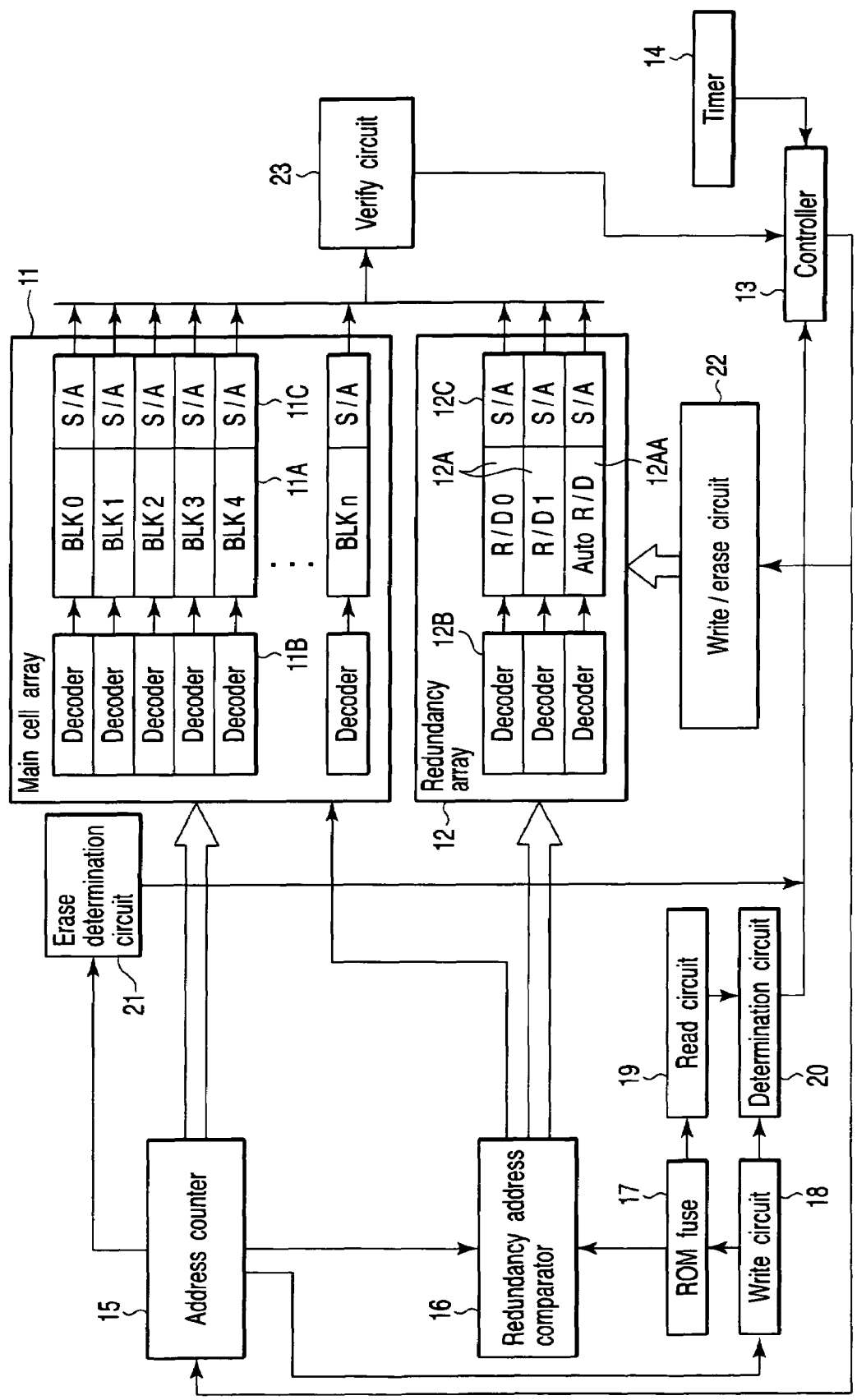
F I G. 5

NONVOLATILE SEMICONDUCTOR MEMORY INCLUDING REDUNDANT CELL FOR REPLACING DEFECTIVE CELL

CROSS-REFERENCE TO RELATED APPLICATIONS

This application is based upon and claims the benefit of priority from prior Japanese Patent Application No. 2005-114749, filed Apr. 12, 2005, the entire contents of which are incorporated herein by reference.

BACKGROUND OF THE INVENTION

1. Field of the Invention

The present invention relates to a nonvolatile semiconductor memory and, more particularly, to a nonvolatile semiconductor memory including a redundant cell for replacing a defective cell or the like.

2. Description of the Related Art

A nonvolatile semiconductor memory generally includes a redundant cell for replacing a defective cell in order to increase the yield as the memory capacity increases.

Three general types of the redundant cell are: column redundancy for relieving a defect on each bit line; row redundancy for relieving a defect on each word line; and block redundancy for relieving a defect in each block.

The types and number of redundant cells incorporated into a nonvolatile semiconductor memory are determined from various viewpoints such as the process, failure mode, chip size, and relieving ratio. Redundant cells are used most often in a period immediately after trial fabrication. In a mass-production period during which the process stabilizes, a relatively few redundant cells are used, and the use ratio also stabilizes at a low value.

Also, defects caused by data rewrite on the market exist on the order of a few ten to a few hundred ppm. Therefore, to decrease the percent defective by finding a defective cell by screening and replacing it with a redundant cell, a very long test time is necessary, and this produces an enormous test cost. Accordingly, it is practically difficult to replace a defective cell with a redundant cell by screening. As a consequence, a nonvolatile semiconductor memory (chip) is often regarded as a defective product although usable redundant cells exist in the device.

Note that as prior art relevant to the present invention, a nonvolatile memory is proposed which automatically locates a defective address, automatically determines whether the defect at the defective address is a row defect, column defect, or bit defect, and automatically replaces the defective cell with a redundant cell, thereby suppressing the increase in number of test steps and the increase in test cost (Jpn. Pat. Appln. KOKAI Publication No. 2000-57795).

BRIEF SUMMARY OF THE INVENTION

A nonvolatile semiconductor memory of the present invention according to the first aspect comprises a cell array comprising a plurality of memory cells; a redundancy array comprising a plurality of redundant cells configured to replace the memory cells; an erase circuit which performs an erase operation on a target cell including one of the memory cell and the redundant cell; a timer which measures a time elapsed from start of the erase operation performed for the target cell by the erase circuit; and a controller which stops the erase operation and replaces the target cell with the redundant cell, when detecting that a predetermined time has elapsed from the start of the erase operation by the measurement of the elapsed time by the timer.

A data erase method in a nonvolatile semiconductor memory comprising a memory cell and a redundant cell configured to replace the memory cell of the present invention according to the second aspect comprises checking whether an unused redundant cell exists if an erase operation for the memory cell is not completed when a predetermined time has elapsed from start of the erase operation; if the unused redundant cell exists, checking whether the memory cell is a redundant cell which is replaced by an operation before the erase operation; if the memory cell is the replaced redundant cell, erasing replacement information indicating that the redundant cell is used in replacement; replacing the memory cell with the unused redundant cell, and writing replacement information indicating that the memory cell is replaced with the unused redundant cell; and resuming the erase operation for the memory cell if the replacement information is normally written.

BRIEF DESCRIPTION OF THE SEVERAL VIEWS OF THE DRAWING

FIG. 2 is a view showing the bit configuration of a ROM fuse in the nonvolatile semiconductor memory of the first embodiment;

FIG. 5 is a block diagram showing the arrangement of the nonvolatile semiconductor memory of the second embodiment of the present invention;

DETAILED DESCRIPTION OF THE INVENTION

Figure 1:
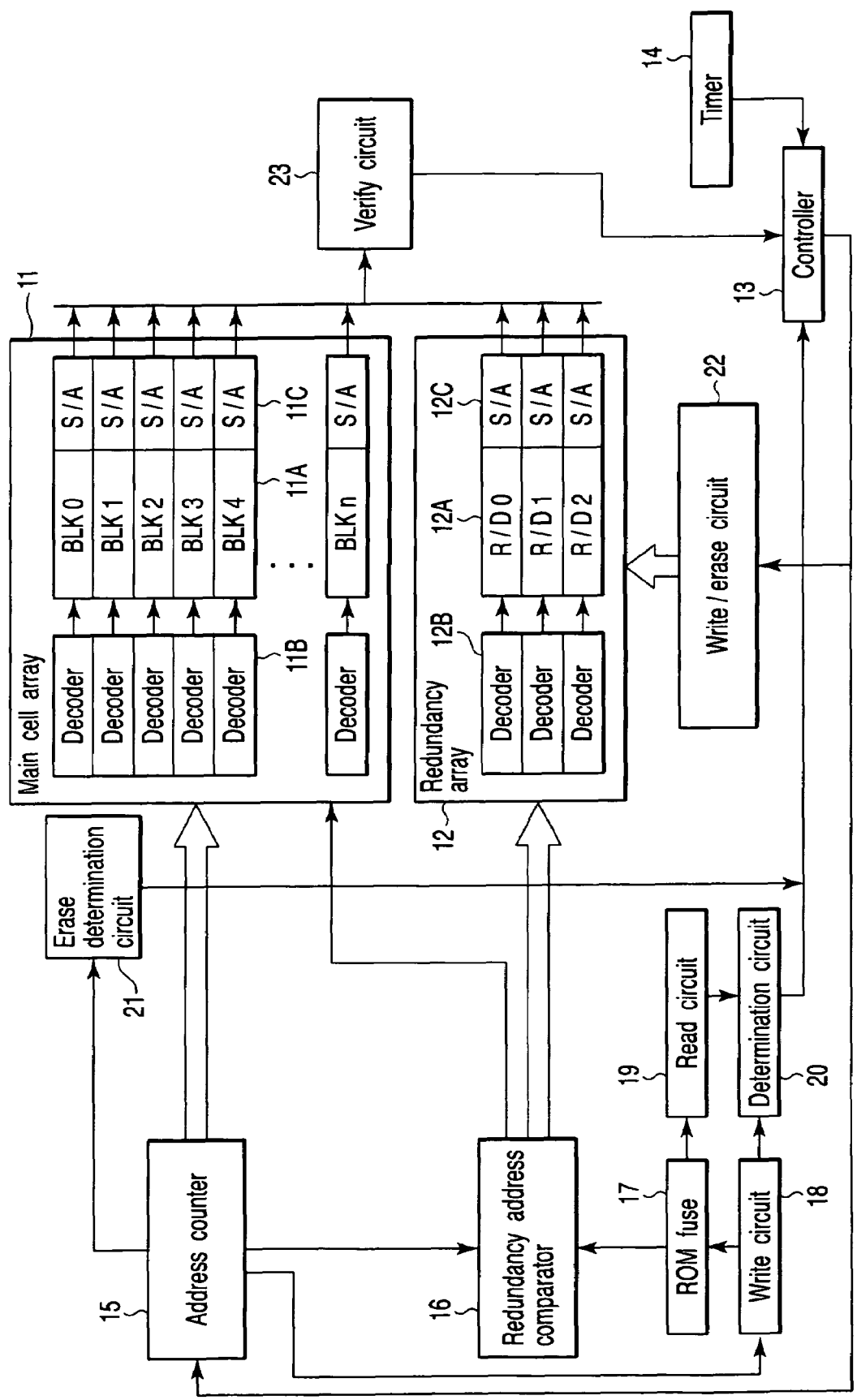
FIG. 1 is a block diagram showing the arrangement of a nonvolatile semiconductor memory of a first embodiment of the present invention.

Nonvolatile semiconductor memories of embodiments of the present invention will be described below with reference to the accompanying drawing. The same reference numerals denote the same parts in all the drawing. In each embodiment of the present invention, an example in which a block which is unsuccessfully erased in an erase operation is automatically relieved by block redundancy will be explained. A block is an erase unit which is erased at once in an erase operation, and has a plurality of memory cells. Block redundancy is a redundant block used to replace a defective block.

First Embodiment

First, a nonvolatile semiconductor memory of the first embodiment of the present invention will be explained below.

FIG. 1 is a block diagram showing the arrangement of the nonvolatile semiconductor memory of the first embodiment.

As shown in FIG. 1, this nonvolatile semiconductor memory comprises a memory cell array including a main cell array 11 and redundancy array 12, a controller 13, a timer 14, an address counter 15, a redundancy address comparator 16, a ROM fuse 17, a write circuit 18, a read circuit 19, a determination circuit 20, an erase determination circuit 21, a write/erase circuit 22, and a verify circuit 23.

In the main cell array 11, a plurality of blocks (BLK0, BLK1, . . . , BLKn) 11A are arranged. A decoder 11B and sense amplifier 11C are connected to each of the blocks (BLK0, BLK1, . . . , BLKn) 11A. Each of the blocks (BLK0, BLK1, . . . , BLKn) 11A includes a plurality of memory cells, and these memory cells in the block are erased at once in an erase operation. The decoder 11B decodes a block address output from the address counter 15, and selects a block designated by the block address. The sense amplifier 11C senses a signal read out from a memory cell in a block, amplifies the signal, and outputs the amplified signal to the verify circuit 23.

In the redundancy array 12, a plurality of redundant blocks (R/D0, R/D1, and R/D2) 12A are arranged. A decoder 12B and sense amplifier 12C are connected to each of the blocks (R/D0, R/D1, and R/D2) 12A. Each of the redundant blocks (R/D0, R/D1, and R/D2) 12A includes a plurality of memory cells, and these memory cells in the redundant block are erased at once in an erase operation. The decoder 12B decodes a block address output from the redundancy address comparator 16, and selects a redundant block designated by the block address. The sense amplifier 12C senses a signal read out from a memory cell in a redundant block, amplifies the signal, and outputs the amplified signal to the verify circuit 23.

The address counter 15 increments block addresses externally input via the controller 13, and outputs these block addresses to the erase determination circuit 21, redundancy address comparator 16, and main cell array 11. The ROM fuse 17 stores the block address of a defective block replaced with a redundant block and use information of the redundant block. The write circuit 18 writes the block address of a defective block replaced with a redundant block and use information of the redundant block in the ROM fuse 17.

FIG. 2 shows the bit configuration of the ROM fuse 17. The ROM fuse 17 has a plurality of storage sets S0, S1, and S2 which respectively correspond to the redundant blocks R/D0, R/D1, and R/D2. A replaced block address and use information of the corresponding redundant block are written in each storage set. The use condition of a redundant block can be confirmed by reading out these pieces of information. Each storage set has a bit string of 11 bits from 0 to 10. The 0th to eighth bits store the block address (to be referred to as a replaced address hereinafter) of a defective block replaced with a redundant block corresponding to the storage set. The ninth bit stores a replacement disable bit (Disable) which indicates that a redundant block corresponding to the storage set is disabled for replacement. The 10th bit stores a replacement enable bit (Enable) which indicates that a redundant block corresponding to the storage set is used in replacement.

The replaced address stored in the ROM fuse 17 is output to the redundancy address comparator 16. The redundancy address comparator 16 compares the block address output from the address counter 15 with the replaced address output from the ROM fuse 17. If the two addresses match, the redundancy address comparator 16 selects a redundant block corresponding to a storage set storing the replaced address. If the two addresses do not match, the redundancy address comparator 16 selects that block in the main cell array 11, which is designated by the block address.

The read circuit 19 reads out the replacement enable bit, replacement disable bit, and replaced address stored in the storage set in the ROM fuse 17. The determination circuit 20 outputs the replacement enable bit and replacement disable bit read out by the read circuit 19 to the controller 13. The determination circuit 20 also determines whether the replacement enable bit, replacement disable bit, and replaced address read out by the read circuit 19 match the information written by the write circuit 18, and outputs the determination result to the controller 13.

The erase determination circuit 21 determines whether the block designated by the block address output from the address counter 15 is a block to be erased, i.e., whether the block is a protect block which is disabled for write or erase, and outputs the determination result to the controller 13.

The write/erase circuit 22 writes data in memory cells in the main cell array 11 and redundancy array 12, or erases a block in the main cell array 11 and a redundant block in the redundancy array 12. The verify circuit 23 verifies whether write or erase is normally performed after a write operation or read operation, and outputs the verification result to the controller 13.

The timer 14 measures the time elapsed from the start of the operation, and notifies the controller 13 of the elapsed time. For example, the timer 14 measures the time elapsed from the start of an erase operation performed on a block or redundant block by the write/erase circuit 22, and notifies the controller 13 that the elapsed time has exceeded a predetermined time. The controller 13 controls the operations of the individual circuits described above in the nonvolatile semiconductor memory.

An erase operation in the nonvolatile semiconductor memory of the first embodiment will be described below.

Figure 3:
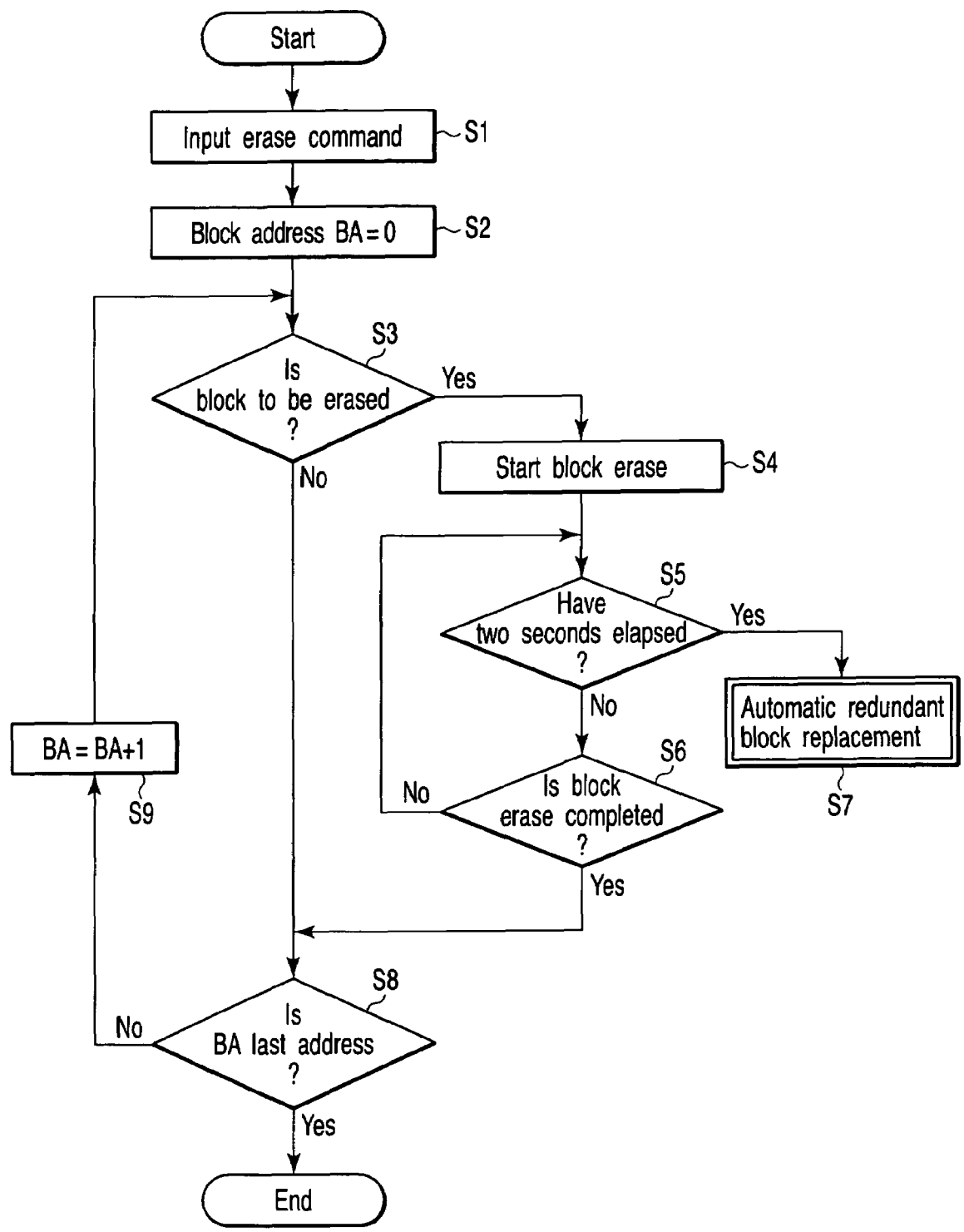
FIG. 3 is a flowchart showing an erase operation in nonvolatile semiconductor memories of the first and second embodiments.
Figure 4:
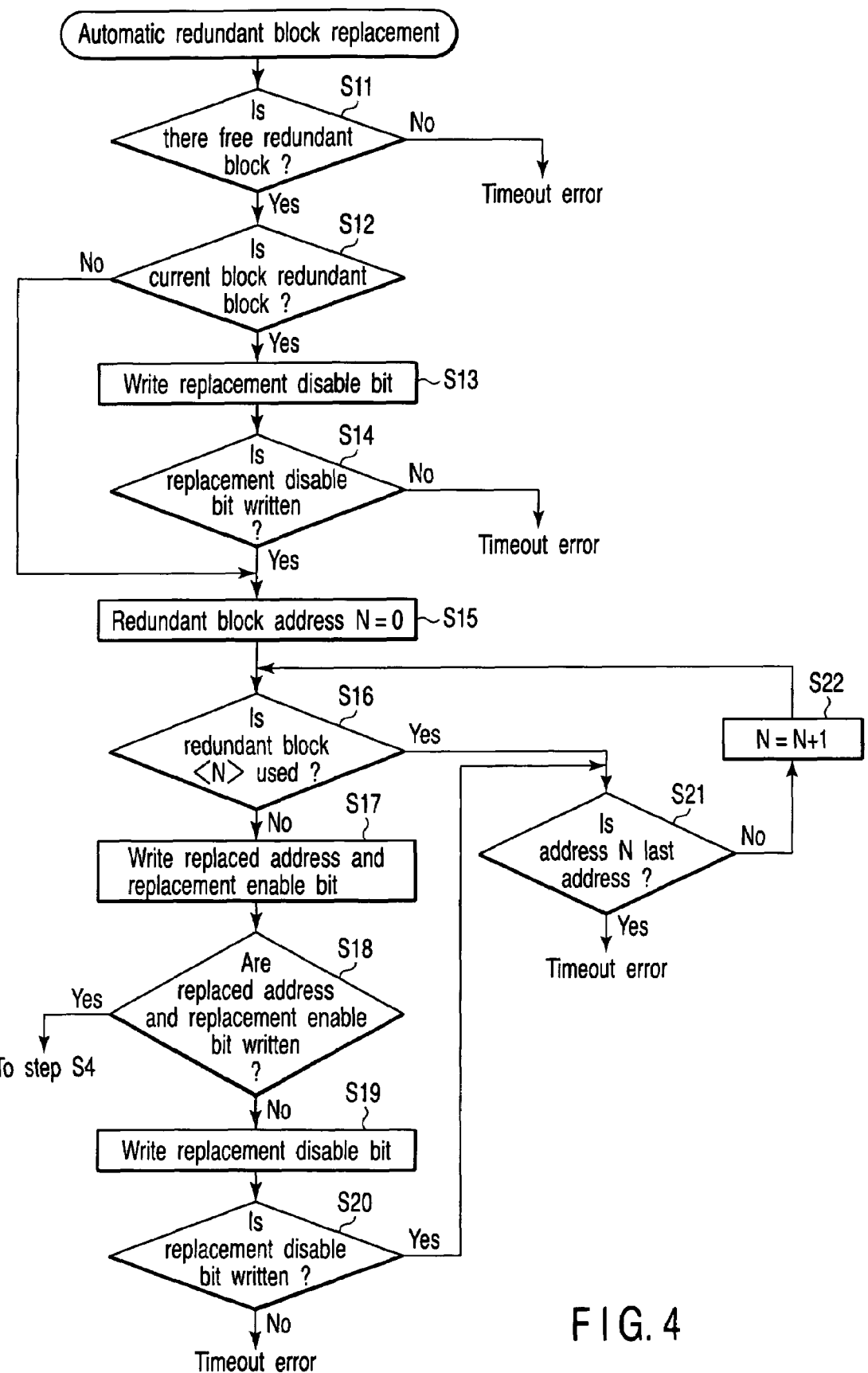
FIG. 4 is a flowchart showing the operation of an automatic redundant block replacement routine in the erase operation of the first embodiment.

FIG. 3 is a flowchart showing the erase operation in the nonvolatile semiconductor memory. FIG. 4 is a flowchart showing the operation of an "automatic redundant block replacement routine" in the erase operation. These operations are executed by the controller 13 by controlling the individual circuits in the device. As described earlier, an example in which a block (defective block) which is unsuccessfully erased in an erase operation is relieved as it is automatically replaced with a redundant block will be explained.

As shown in FIG. 3, an erase command for the memory cell array or for the whole chip is input to the controller 13 (step S1), thereby starting the erase operation. First, the controller 13 sets block address BA in the address counter 15 to "0" (step S2).

Then, the controller 13 checks whether the block designated by block address BA is an object of erase (step S3). That is, the controller 13 checks whether the block at block address BA is a protect block which is disabled for erase. If the block at block address BA is an object of erase, erase of the block is started (step S4). In this block erase, for example, the write/erase circuit 22 sequentially executes write before erase, erase, and weak write as follows.

Of memory cells in one block in which "1" (an erased state) and "0" (a written state) exist at random, only the threshold value of a memory cell having "1" is written to a program verify voltage or more, thereby performing write before erase. Then, all the memory cells in the block are simultaneously erased. This operation decreases the threshold values of all the memory cells to an erase verify voltage or less. When the simultaneous erase operation is completed, an over-erased memory cell is sometimes produced in the memory cells of the block. Therefore, weak write is performed on this over-erased memory cell by an over-erase verify voltage.

In step S4, block erase is started. If this block is not completely erased even when a predetermined time (e.g., two seconds) has elapsed, an automatic redundant block replacement routine begins (steps S5 to S7). That is, if the erase execute time exceeds the predetermined time during the erase operation, the controller 13 determines that the block to be erased is a defective block, and starts the automatic redundant block replacement routine.

On the other hand, if the block at block address BA is not an object of erase, or if block erase is completed, the controller 13 checks whether block address BA is the last address (step S8). If block address BA is the last address, the controller 13 terminates the erase operation. If block address BA is not the last address, the controller 13 increments block address BA (step S9), and returns to step S3 to check whether the block at block address "BA+1" is an object of erase.

In steps S2 to S9 described above, a block to be erased is searched for, and, if a block to be erased is found, block erase is started. Then, as described above, if this block is not completely erased even when a predetermined time has elapsed since the start of block erase, the flow advances to the automatic redundant block replacement routine.

This "automatic redundant block replacement routine" will be described below with reference to FIG. 4.

First, the read circuit 19 reads out the storage sets from the ROM fuse 17, and the determination circuit 20 determines whether there is an unused storage set, thereby checking whether there is a free redundant block (step S11). That is, whether there is an unused redundant block in the nonvolatile semiconductor memory is checked. Note that the presence/absence of a free redundant block depends on the use conditions of redundant blocks in a shipment test. If there is no free redundant block (if all redundant blocks are used), the flow advances to the erase operation, and retries it until a predetermined time at which an erase error occurs. After the predetermined time is over, timeout error processing is performed.

If there is a free redundant block, whether a block (defective block) to be replaced is an already replaced redundant block is checked (step S12). If the block to be replaced is not a redundant block, the flow advances to step S15. If the block to be replaced is a redundant block, replacement information indicating that this redundant block is used in replacement is deleted. That is, information is written in the replacement disable bit of that storage set in the ROM fuse 17, which corresponds to the redundant block (step S13).

Since the replacement information of the redundant block is held in the ROM fuse 17 as a nonvolatile memory, delete of the replacement information is equivalent to an erase operation. However, the execution time of erase is longer than that of write. Therefore, the replacement disable bit is formed, and the replacement information is deleted by writing data in this bit.

Then, the read circuit 19 reads out the storage set from the ROM fuse 17, and the determination circuit 20 determines whether the replacement disable bit is normally written (step S14). If the replacement disable bit is normally written, the flow advances to step S15; if not, timeout error processing is performed.

After step S15, a process of finding an unused redundant block and replacing a block (defective block) to be erased with the unused redundant block is performed. More specifically, address N of the redundant block is set to "0" in step S15. Then, whether the redundant block designated by address N is already used is checked (step S16). If the redundant block at address N is not used, the replaced address is written in that storage set in the ROM fuse 17, which corresponds to the redundant block, and the replacement enable bit is written after that (step S17). This write to the storage set is done by the write circuit 18, i.e., the write circuit 18 writes block address BA supplied from the address counter 15 as the replaced address in the storage set.

Subsequently, the read circuit 19 reads out the storage set from the ROM fuse 17, and outputs the readout replaced address and replacement enable bit to the determination circuit 20. The determination circuit 20 compares the replaced address and replacement enable bit output from the read circuit 19 with the information to be written which is output from the write circuit 18, thereby determining whether the replaced address and replacement enable bit are normally written in the storage set (step S18). If the replaced address and replacement enable bit are normally written, the flow advances to step S4 to resume block erase. In this manner, the automatic redundant block replacement routine is completed.

On the other hand, if the replaced address and replacement enable bit are not normally written, information is written in the replacement disable bit of the storage set (step S19). More specifically, if the replaced address and replacement enable bit are not normally written, write is repeated a preset number of times or less. If the preset number of times is over, information indicating that the redundant block is unusable is written in the replacement disable bit.

Subsequently, whether the replacement disable bit is normally written is checked (step S20). If the replacement disable bit is normally written, the flow advances to step S21 to search for another redundant block usable in replacement. First, whether address N is the last address is checked (step S21). If address N is the last address, there is no unused redundant block, so timeout error processing is performed. If address N is not the last address, address N is incremented (step S22), and the flow returns to step S16 to recheck whether the redundant block at address N is used. After step S16, the same processing as above is repeated. On the other hand, if the replacement disable bit is not normally written in step S20, timeout error processing is performed. In this way, the automatic redundant block replacement routine is completed.

Also, in step S17, the replaced address is written, and the replacement enable bit is written after write verify has passed. This takes a measure to cope with a case in which the user interrupts the erase operation by, e.g., shutting down the power supply or resetting the device. Assume, for example, that when the replaced address and replacement enable bit are simultaneously written, only the replacement enable bit is written, and the replaced address is not completely written. If the power supply is shut down or the device is reset in this state, a wrong address currently being written is detected as the replaced address. This is equivalent to replacing a normal block which is not an object of erase with a redundant block by mistake. The result is a fatal situation in which data stored in the normal block is apparently erased.

It is also possible to form, in the storage set of the ROM fuse 17, an automatic replacement recognition bit indicating that replacement is performed by the automatic redundant block replacement routine, and to write information in this automatic replacement recognition bit in step S17. This makes it possible to distinguish between replacement in the test step and replacement by the automatic redundant block replacement routine, and improve the traceability of the nonvolatile semiconductor memory. If the nonvolatile semiconductor memory is returned as a defective product, it is possible to distinguish between the redundant block use ratio in the test step and that in the automatic redundant block replacement routine. This helps find out the conditions of a stress test and the like.

In addition, when an unused redundant block, i.e., a redundant block to be used in replacement in this case, is erased beforehand in the test step, this redundant block need not be erased after information is written in the ROM fuse 17. As a consequence, the erase operation time can be greatly reduced. That is, after the processing in step S18, the flow can directly return to step S8 without returning to step S4 to erase the replaced redundant block. This can shorten the erase time.

Furthermore, if an unused redundant block is defective, it is possible to write this information in the replacement disable bit in advance, thereby preventing selection of this redundant block by mistake in a series of processes of the "automatic redundant block replacement routine". This can also shorten the erase time. In the test step, tests must be performed without using the processes of the "automatic redundant block replacement routine". Therefore, it is preferable to form a means capable of selecting whether to execute the "automatic redundant block replacement routine".

The above embodiment is explained by taking a redundant block for relieving a defect in each block as an example. However, the present invention is also applicable to a redundant bit line for relieving a defect on each bit line, or a redundant word line for relieving a defect on each word line.

In the nonvolatile semiconductor memory of the first embodiment as described above, even if a defective cell forms on the market after the memory is shipped as a product to the market, the device itself can automatically replace the defect with a redundant cell. This can greatly reduce defects occurring on the market.

Second Embodiment

A nonvolatile semiconductor memory of the second embodiment of the present invention will be described below. The same reference numerals as in the first embodiment denote the same parts to omit an explanation thereof, and only different parts will be explained below. The first embodiment uses the method of searching a plurality of redundant blocks for an unused redundant block. In the second embodiment, a specific redundant block is formed as a block to be exclusively used in an "automatic redundant block replacement routine".

FIG. 5 is a block diagram showing the arrangement of the nonvolatile semiconductor memory of the second embodiment.

In a redundancy array 12, a plurality of redundant blocks (R/D0 and R/D1) 12A and an automatic redundant block (Auto R/D) 12AA are arranged. A decoder 12B and sense amplifier 12C are connected to each of the redundant blocks (R/D0 and R/D1) 12A and automatic redundant block 12AA. Each of the redundant blocks (R/D0 and R/D1) 12A and automatic redundant block 12AA includes a plurality of memory cells. In an erase operation, these memory cells in the redundant block or automatic redundant block are erased at once. The automatic redundant block 12AA is a redundant block to be exclusively used in the automatic redundant block replacement routine. The rest of the block configuration is the same as in the first embodiment shown in FIG. 1.

Figure 6:
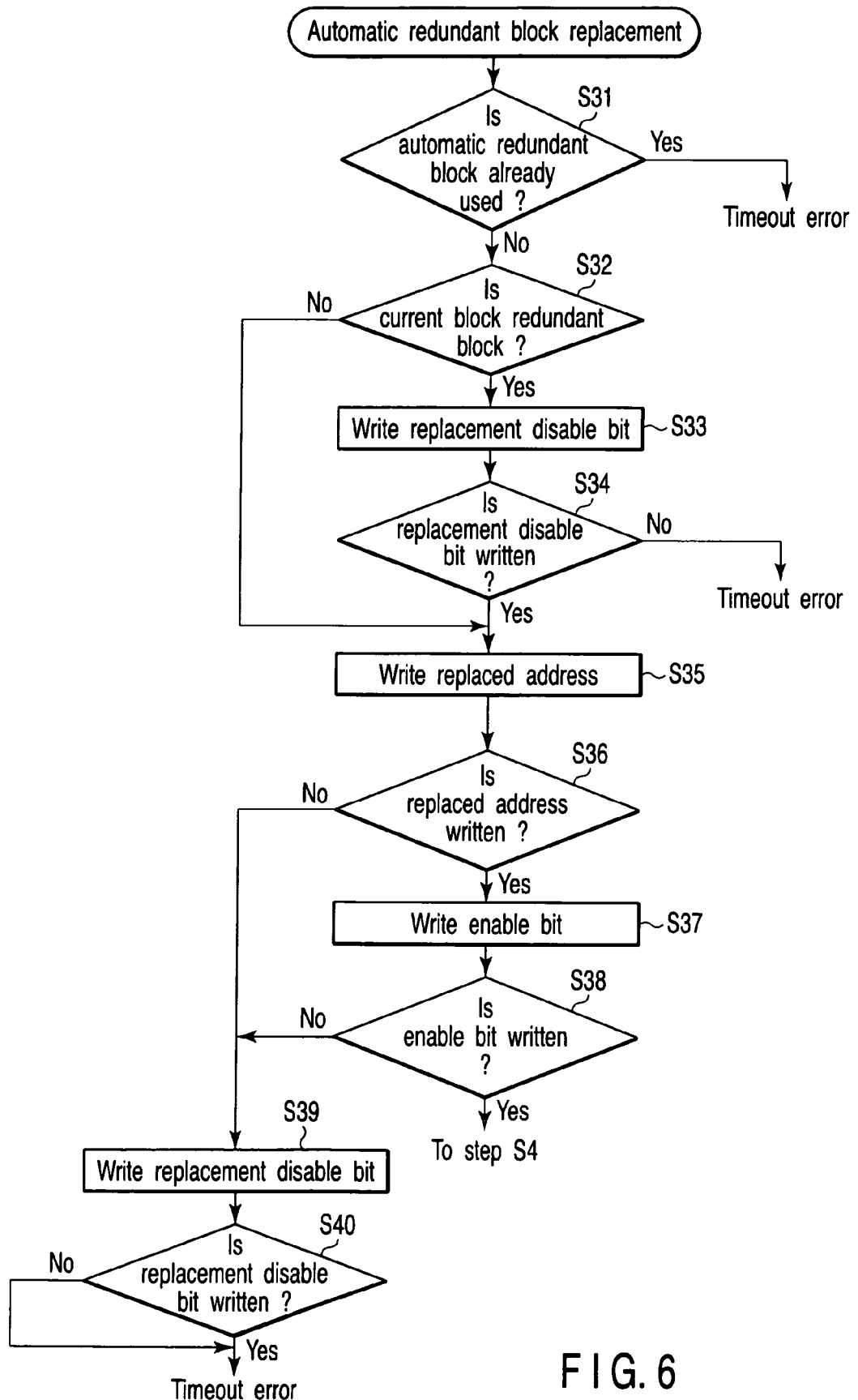
FIG. 6 is a flowchart showing the operation of an automatic redundant block replacement routine in the erase operation of the second embodiment.

The erase operation in the nonvolatile semiconductor memory of the second embodiment will be explained below. A flowchart showing the erase operation in the second embodiment is the same as in the first embodiment shown in FIG. 3. FIG. 6 shows a flowchart of the "automatic redundant block replacement routine" different from the first embodiment.

First, as shown in FIG. 6, whether the automatic redundant block to be exclusively used in the automatic redundant block replacement routine is already used is checked (step S31). If the automatic redundant block is not used, whether a block (defective block) to be replaced is an already replaced redundant block is checked (step S32). If the block to be replaced is not a redundant block, the flow advances to step S35. If the block to be replaced is a redundant block, replacement information of the redundant block is deleted. That is, information is written in a replacement disable bit (Disable) of that storage set in a ROM fuse 17, which corresponds to the redundant block (step S33). As in the first embodiment, the execution time of erase is longer than that of write. Therefore, the replacement disable bit is formed, and the replacement information is deleted by writing information in this bit.

On the other hand, if the automatic redundant block is already used in step S31, the flow advances to an erase operation, and retries it until a predetermined time at which an erase defect occurs. After the predetermined time is over, timeout error processing is performed.

Then, a read circuit 19 reads out the storage set from the ROM fuse 17, and a determination circuit 20 determines whether the replacement disable bit is normally written (step S34). If the replacement disable bit is normally written, the flow advances to step S35; if not, timeout error processing is performed.

In step S35, a replaced address is written in that storage set in the ROM fuse 17, which corresponds to the unused redundant block. Subsequently, the read circuit 19 reads out the storage set from the ROM fuse 17, and outputs the readout replaced address to the determination circuit 20. The determination circuit 20 compares the replaced address output from the read circuit 20 with an address to be written which is output from a write circuit 18, and checks whether the two addresses match, thereby determining whether the replaced address is normally written in the storage set (step S36).

If the replaced address is normally written, a replacement enable bit (Enable) is written in that storage set in the ROM fuse 17, which corresponds to the automatic redundant block (step S37). Subsequently, the read circuit 19 reads out the storage set from the ROM fuse 17, and the determination circuit 20 determines whether the replacement enable bit is normally written in the storage set (step S38). If the replacement enable bit is normally written, the flow returns to step S4 to resume block erase, thereby completing the automatic redundant block replacement routine.

On the other hand, if the replaced address is not normally written in step S36, and if the replacement enable bit is not normally written in step S38, information is written in the replacement disable bit of the storage set (step S39). More specifically, if the replaced address and replacement disable bit are not normally written, write is repeated a preset number of times or less. If the preset number of times is over, information indicating that this automatic redundant block is unusable is written in the replacement disable bit. Subsequently, the read circuit 19 reads out the storage set from the ROM fuse 17, and the determination circuit 20 determines whether the replacement disable bit is normally written (step S40). Since there is only one automatic redundant block in this case, timeout error processing is performed regardless of whether the replacement disable bit is normally written. In this manner, the automatic redundant block replacement routine is completed.

In the second embodiment, a redundant block to be exclusively used in the automatic redundant block replacement routine is formed, so the erase operation can be controlled simply and rapidly. Although the second embodiment uses only one automatic redundant block to be exclusively used in the automatic redundant block replacement routine, a plurality of automatic redundant blocks may also be used.

Also, the above embodiment is explained by taking a redundant block for relieving a defect in each block as an example. However, the present invention is also applicable to a redundant bit line for relieving a defect on each bit line, or a redundant word line for relieving a defect on each word line.

In the nonvolatile semiconductor memory of the second embodiment as described above, even if a defective cell forms on the market after the memory is shipped as a product to the market, the device itself can automatically replace the defect with a redundant cell. This can greatly reduce defects occurring on the market.

Third Embodiment

A nonvolatile semiconductor memory of the third embodiment of the present invention will be explained below.

Figure 7:
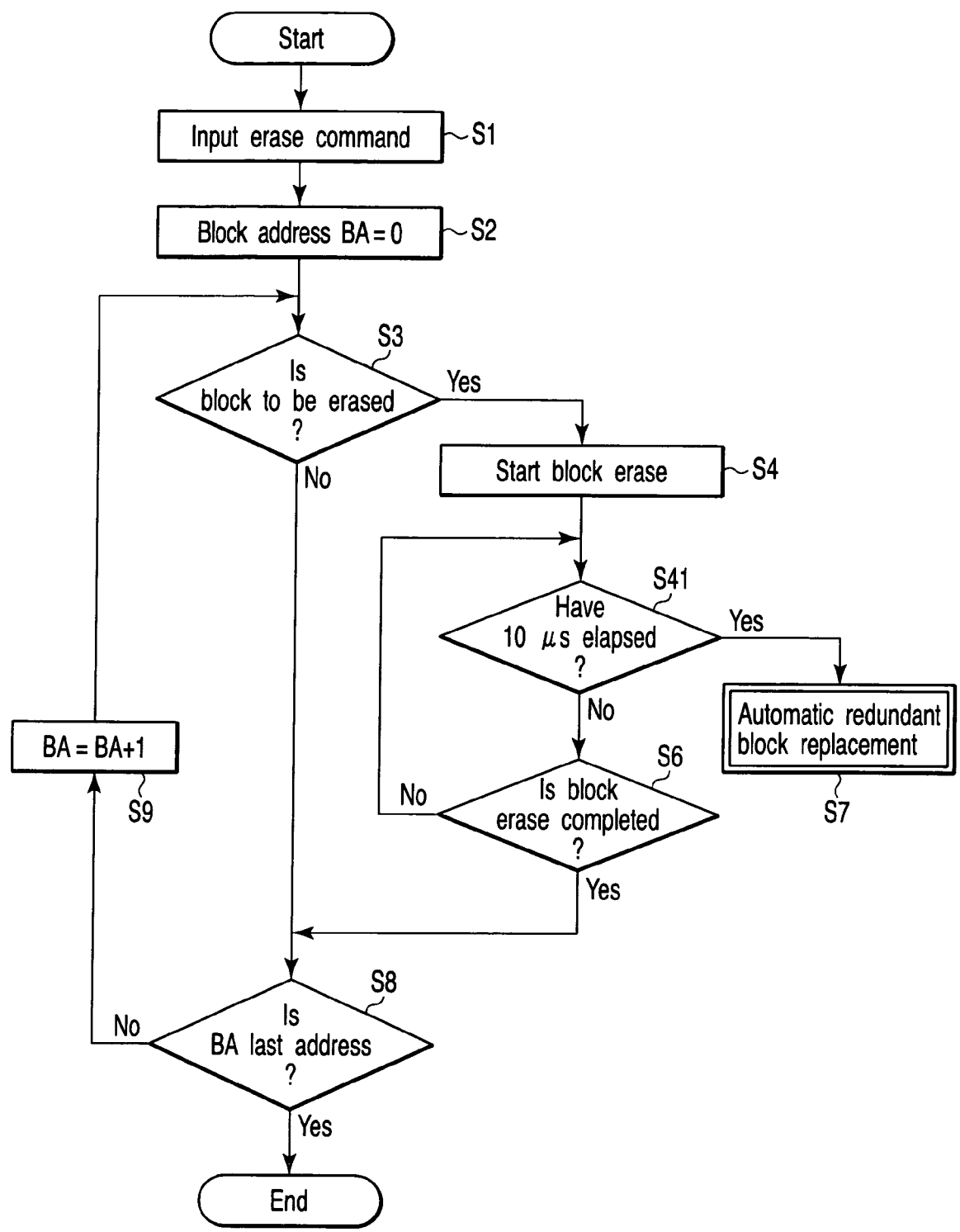
FIG. 7 is a flowchart showing an erase operation in a nonvolatile semiconductor memory of a third embodiment.

In the first and second embodiments, the automatic redundant block replacement routine starts when two seconds elapse from the start of block erase, and this set time is very long. Accordingly, it takes a very long time to check the operation in the test step. In the third embodiment, therefore, as shown in FIG. 7, in order to reduce the time required to check the operation in the test step, the transition time from the start of block erase to the automatic redundant block replacement routine is set to a few ten $\mu$s, e.g., 10 $\mu$s (step S41). The rest of the arrangement is the same as in the first and second embodiments.

The embodiments of the present invention relate to replacement of a redundant cell in a nonvolatile semiconductor memory. If an erase operation currently being executed is not completed within a predetermined time, a block to be erased can be automatically replaced with a redundant cell usable in replacement (the automatic redundant cell replacement method). Each embodiment of the present invention can provide a nonvolatile semiconductor memory capable of automatically replacing a defective cell which has formed on the market with a redundant cell.

Also, the individual embodiments described above can be practiced alone or by appropriately combining them. In addition, these embodiments include inventions in various stages. Accordingly, it is possible to extract inventions in various stages by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a cell array comprising a plurality of memory cells;
   a redundancy array comprising a plurality of redundant cells configured to replace the memory cells;
   an erase circuit which performs an erase operation on a target cell including one of the memory cell and the redundant cell;
   a timer which measures a time elapsed from start of the erase operation performed for the target cell by the erase circuit;
   a controller which stops the erase operation and replaces the target cell with the redundant cell, when detecting that a predetermined time has elapsed from the start of the erase operation by the measurement of the elapsed time by the timer;
   a storage circuit which is formed for each redundant cell, and stores an address, replacement enable information, and replacement disable information, the address being an address of the memory cell replaced with the redundant cell, the replacement enable information indicating that the redundant cell is used in replacement, and the replacement disable information indicating that the redundant cell is disabled for replacement;
   a write circuit which writes the address, the replacement enable information, and the replacement disable information in the storage circuit; and
   a read circuit which reads out the address, replacement enable information, and replacement disable information stored in the storage circuit,
   wherein the control circuit checks whether an unused redundant cell exists by causing the read circuit to read out the replacement enable information and replacement disable information stored in the storage circuit,
   if the unused redundant cell exists, checks whether the target cell for which the predetermined time has elapsed from the start of the erase operation is an already replaced redundant cell,
   if the target cell is a replaced redundant cell, writes the replacement disable information in the storage circuit which corresponds to the redundant cell, and
   writes an address and replacement enable information of the target cell in the storage circuit which corresponds to the unused redundant cell.

2. The memory according to claim 1, further comprising a determination circuit which compares the address, replacement enable information, and replacement disable information to be written by the write circuit with the address, replacement enable information, and replacement disable information written in the storage circuit by the write circuit, and outputs a comparison result to the controller,
   wherein the controller starts the erase operation for the replaced redundant cell, when determining, on the basis of the comparison result, that the address and replacement enable information of the target cell are normally written.

3. The memory according to claim 2, wherein, of a first address, first replacement enable information, and first replacement disable information to be written by the write circuit, and a second address, second replacement enable information, and second replacement disable information written in the storage circuit by the write circuit, the determination circuit outputs, to the controller, a result of at least one of a comparison between the first address and the second address, a comparison between the first replacement enable information and the second replacement enable information, and a comparison between the first replacement disable information and the second replacement disable information.

4. The memory according to claim 1, wherein when the address and replacement enable information of the target cell are to be written, the address of the target cell is written first, and the replacement enable information is written after it is verified that the address is normally written.

5. The memory according to claim 1, further comprising:
   an address counter which receives an externally input address; and
   a redundancy address comparator which compares an address output from the address counter with an address output from the storage circuit,
   wherein the redundancy address comparator selects a redundant cell corresponding to the storage circuit if the output address from the address counter matches the output address from the storage circuit.

6. The memory according to claim 1, further comprising an erase determination circuit which determines whether the target cell is a protect cell which is disabled for erase, wherein the controller causes the erase determination circuit to determine whether the target cell is the protect cell, before checking whether the unused redundant cell exists.

7. The memory according to claim 1, wherein the redundancy array comprises a dedicated redundant cell which is used in replacement only if the erase operation of the target cell is not completed when a predetermined time has elapsed from the start of the erase operation.

8. The memory according to claim 1, wherein the storage circuit stores replacement recognition information indicating a redundant cell which is used in replacement because the erase operation of the target cell is not completed when a predetermined time has elapsed from the start of the erase operation.

9. The memory according to claim 1, wherein the storage circuit comprises a ROM fuse including a storage capacity of a plurality of bits.

* * * * *